(12) United States Patent
Song et al.

(10) Patent No.: US 12,218,629 B2
(45) Date of Patent: Feb. 4, 2025

(54) SOLAR POWER LEVELING SYSTEM VIA STRING-BASED POWER COMPENSATION

(71) Applicant: E2Z CO., LTD., Jeju-si (KR)

(72) Inventors: Ki Taek Song, Jeju-si (KR); Cheol Song Lee, Jeju-si (KR); Kyung Rok Kim, Jeju-si (KR); Jun Woo Kim, Jeju-si (KR)

(73) Assignee: E2Z CO., LTD., Jeju-si (KR)

( * ) Notice: Subject to any disclaimer, the term of this patent is extended or adjusted under 35 U.S.C. 154(b) by 25 days.

(21) Appl. No.: 18/268,260

(22) PCT Filed: Dec. 22, 2020

(86) PCT No.: PCT/KR2020/018852
§ 371 (c)(1),
(2) Date: Jun. 19, 2023

(87) PCT Pub. No.: WO2022/139003
PCT Pub. Date: Jun. 30, 2022

(65) Prior Publication Data
US 2024/0056026 A1   Feb. 15, 2024

(51) Int. Cl.
*H02S 40/36* (2014.01)
*G01R 31/382* (2019.01)
*H02J 7/00* (2006.01)
*H02J 7/35* (2006.01)
*H02S 40/32* (2014.01)
*H02S 50/10* (2014.01)

(52) U.S. Cl.
CPC ............ *H02S 40/36* (2014.12); *G01R 31/382* (2019.01); *H02J 7/0068* (2013.01); *H02J 7/35* (2013.01); *H02S 40/32* (2014.12); *H02S 50/10* (2014.12)

(58) Field of Classification Search
None
See application file for complete search history.

(56) References Cited

U.S. PATENT DOCUMENTS

2016/0285264 A1\* 9/2016 Urry ........................ H02J 3/38
2018/0175789 A1\* 6/2018 Cherukupalli ......... G01R 31/26

FOREIGN PATENT DOCUMENTS

KR    10-1648924 B1    8/2016
KR    10-2051402 B1    12/2019

\* cited by examiner

*Primary Examiner* — Jared Fureman
*Assistant Examiner* — Aqeel H Bukhari
(74) *Attorney, Agent, or Firm* — Goldilocks ZONE IP Law

(57) ABSTRACT

Proposed is a solar power leveling system, more particularly, a solar power leveling system via string-based power compensation, wherein outputs between strings are equalized by charging or discharging using a power compensation device so that output through solar power generation is maximized with a simple device configuration, and when there is reduction in output of a plurality of strings, compensation power for maximizing the total string output is calculated to achieve power compensation, whereby the power compensation device performs power compensation with a single discharging part and maximizes the total power generation amount of the strings connected to each other in parallel.

8 Claims, 9 Drawing Sheets

[FIG. 1]
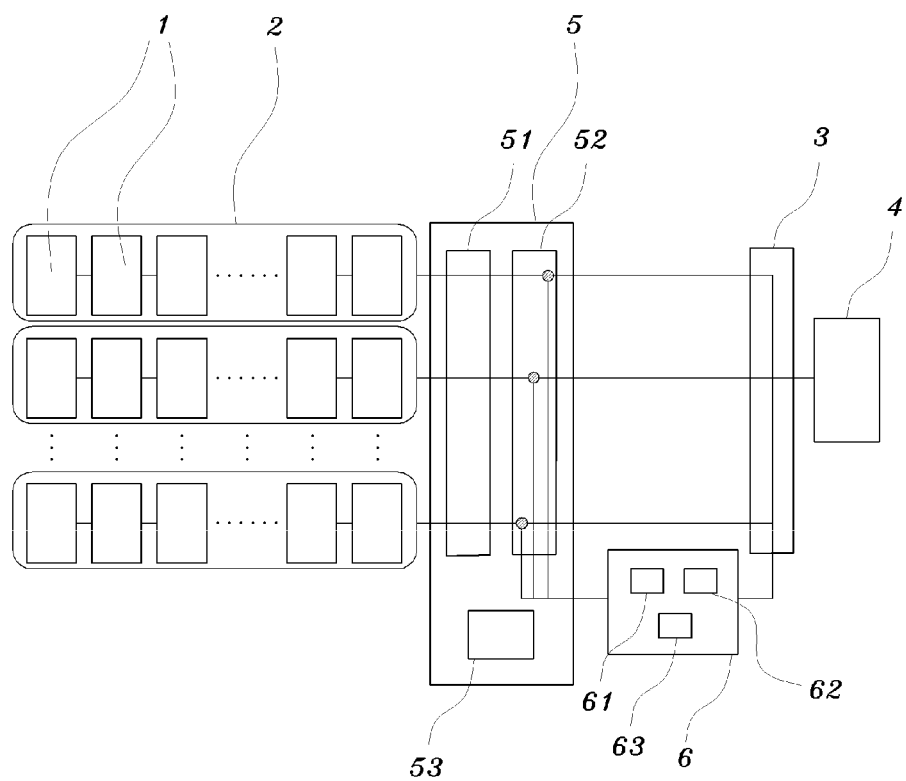

[FIG. 2]
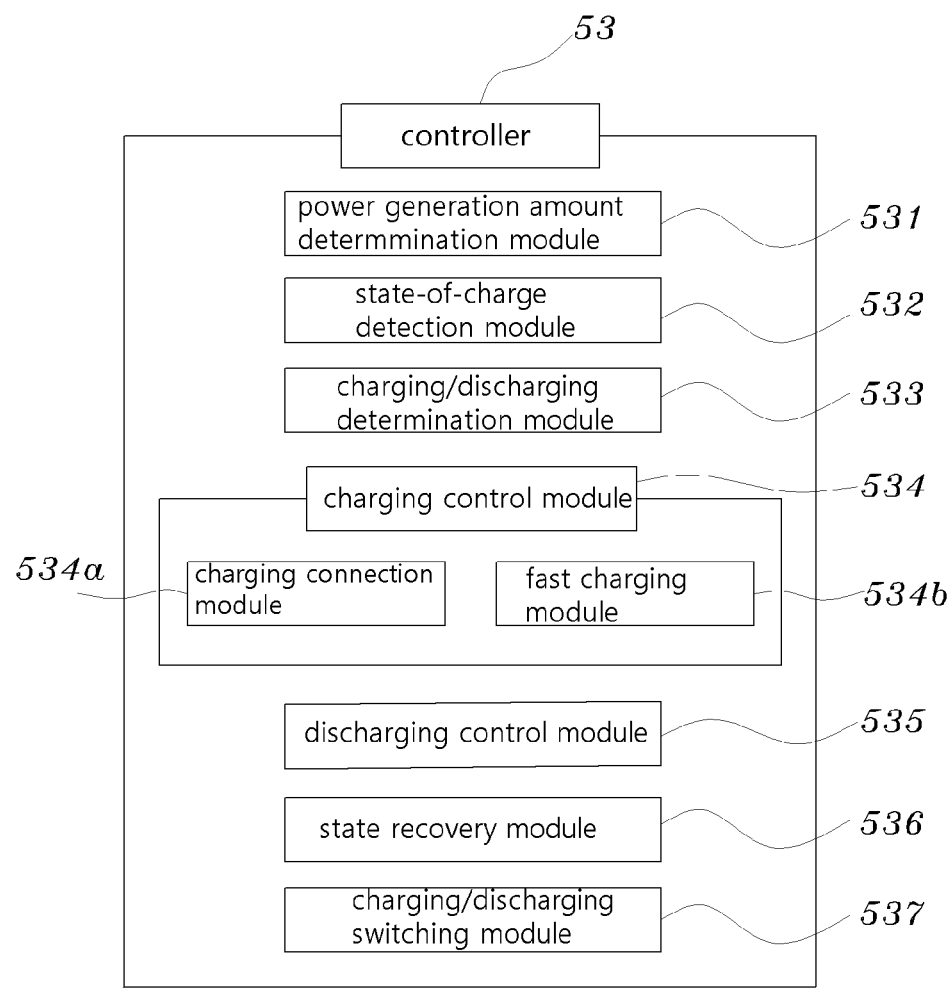

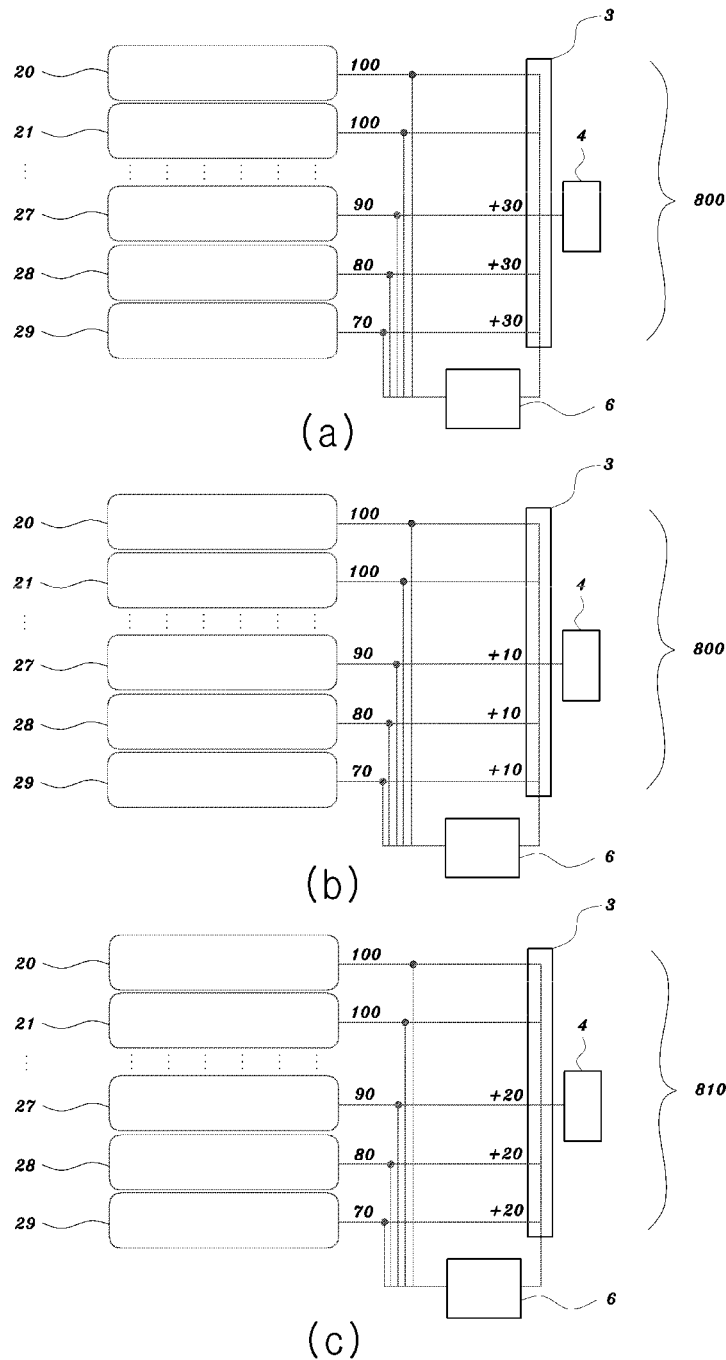

[FIG. 4]
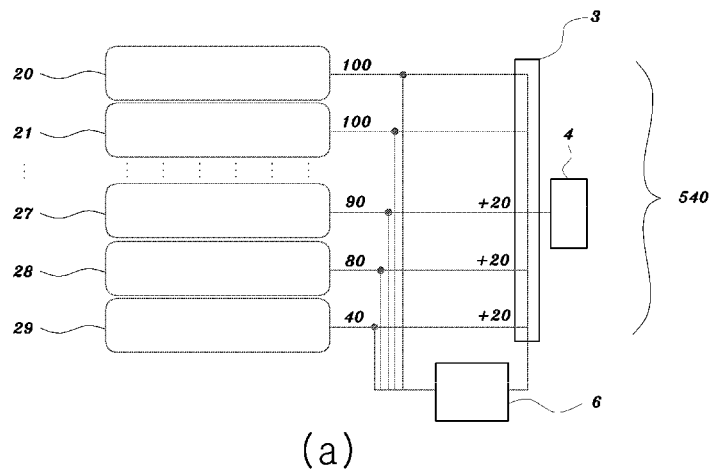
(a)
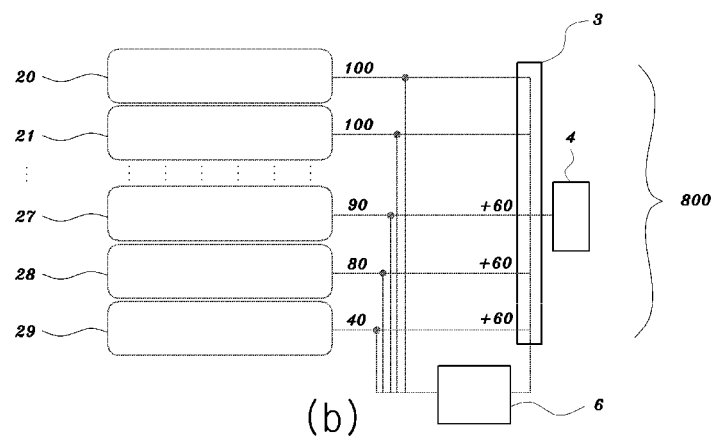
(b)
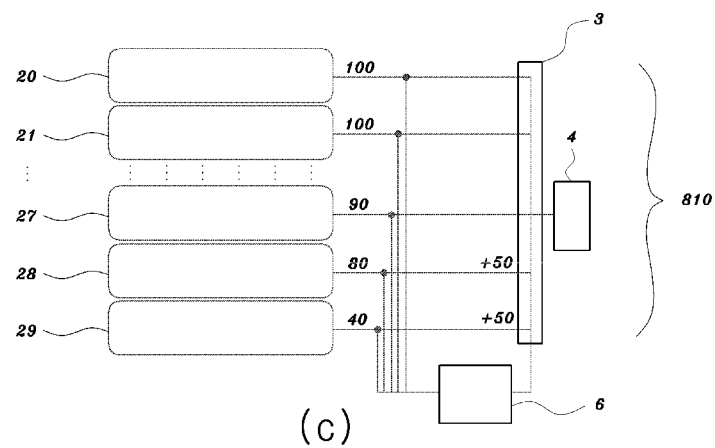
(c)

[FIG. 5]
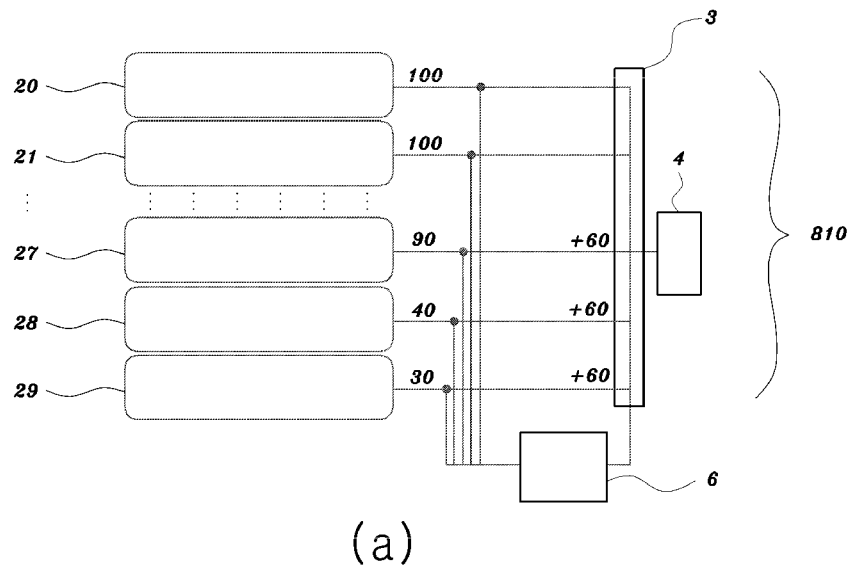
(a)
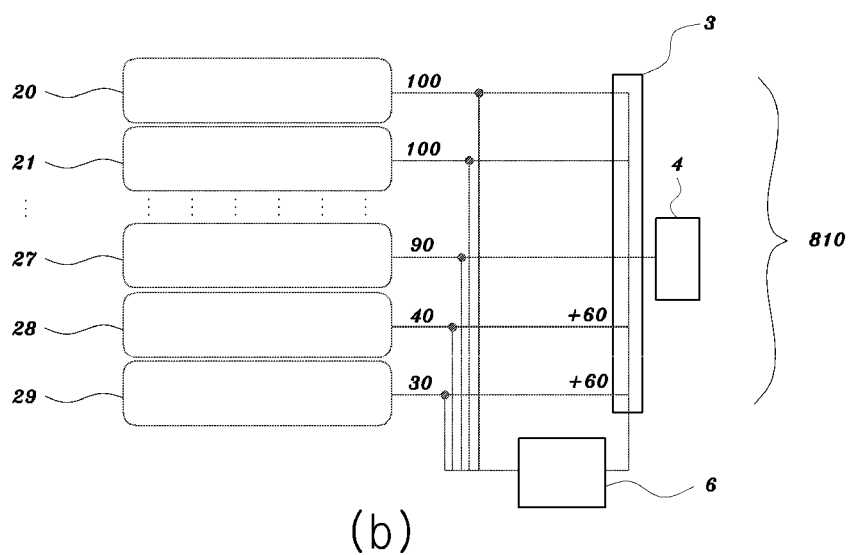
(b)

[FIG. 6]
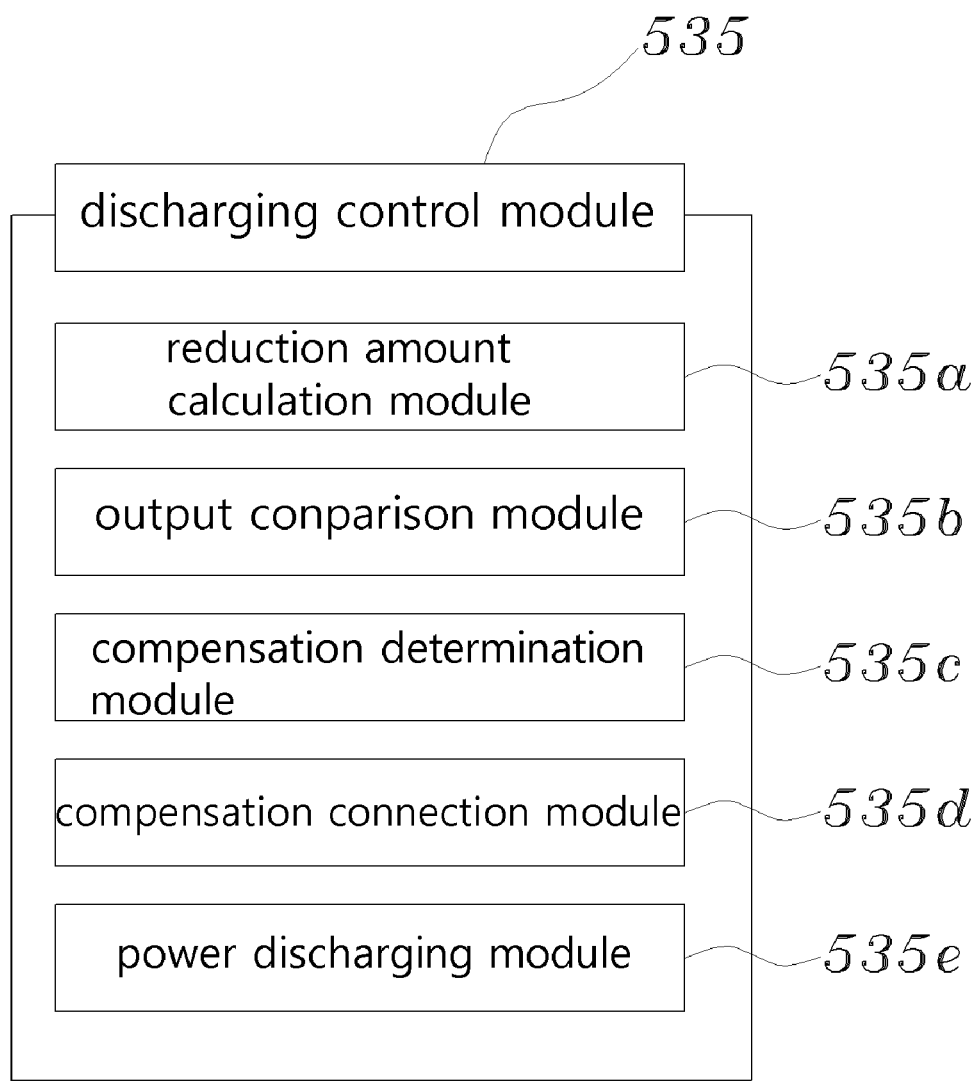

[FIG. 7]
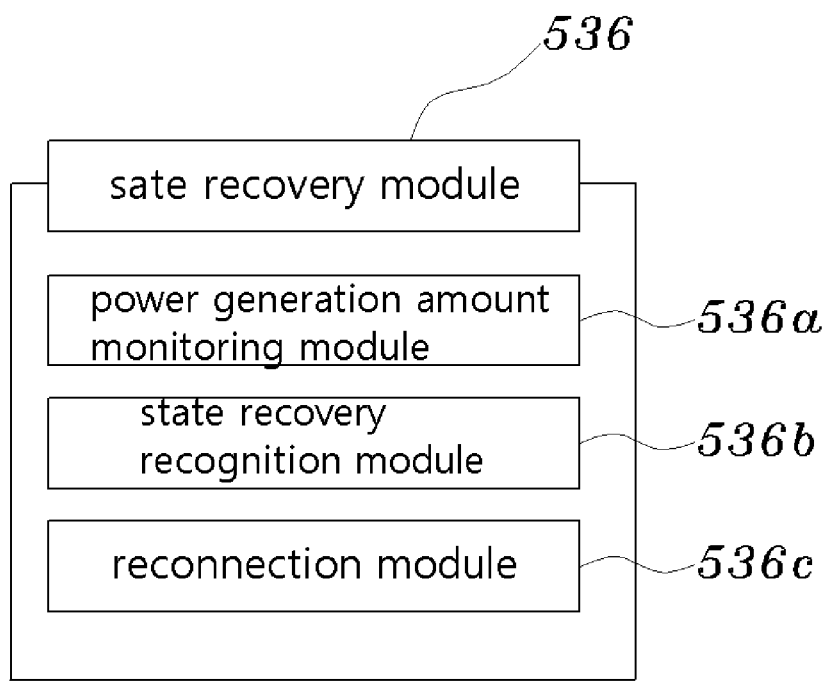

[FIG. 8]
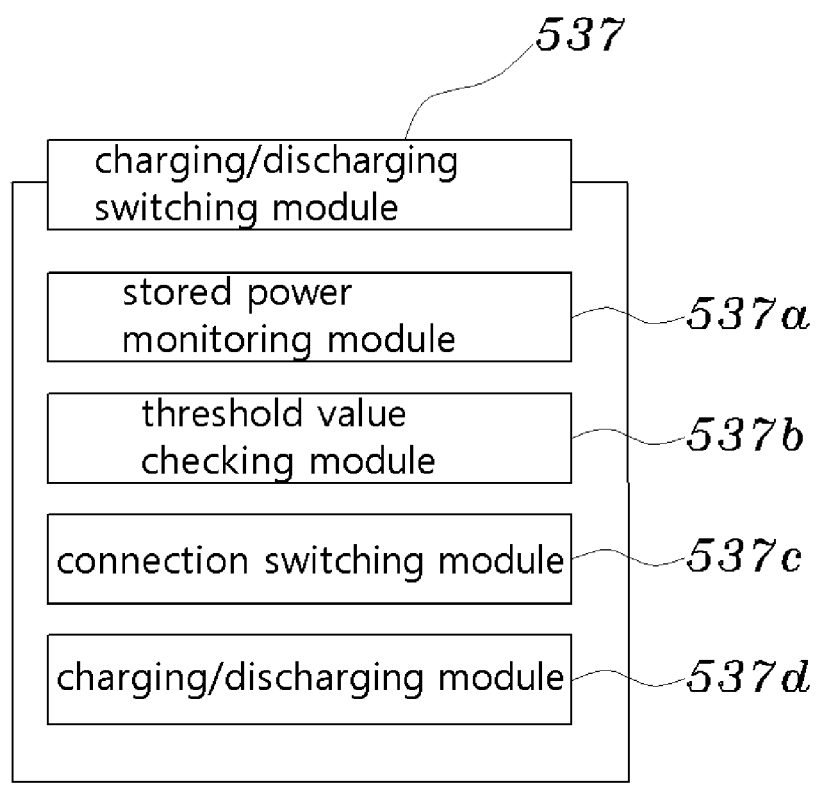

[FIG. 9]
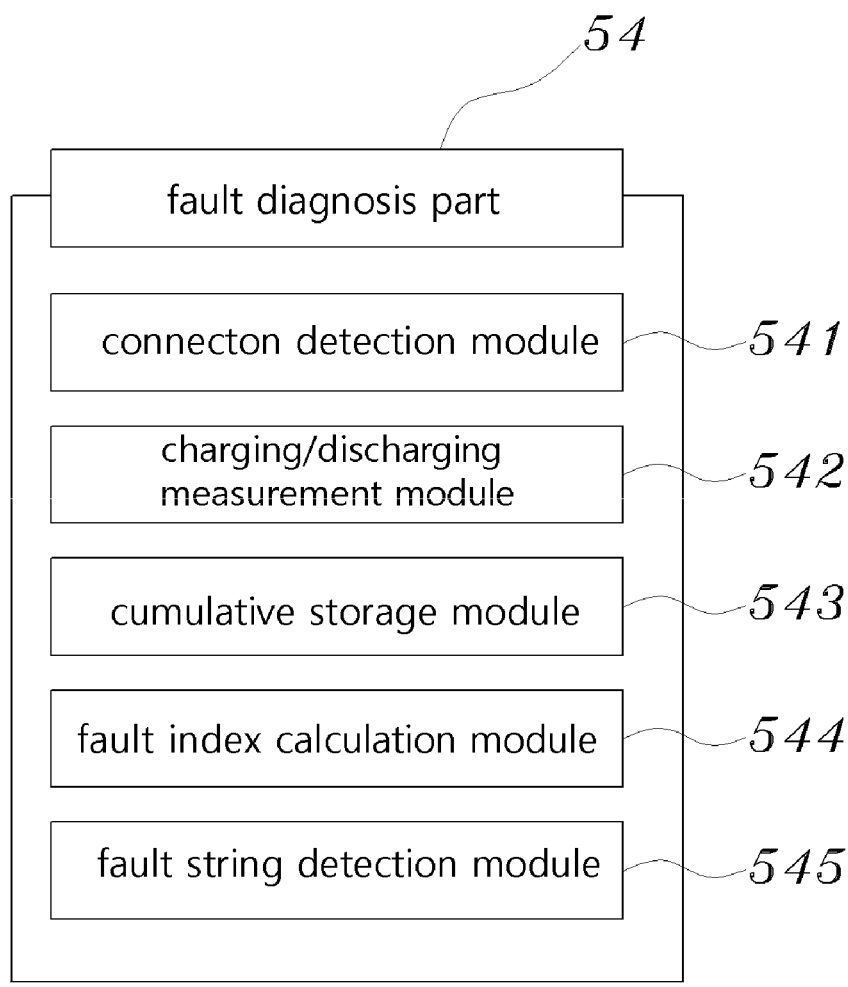

SOLAR POWER LEVELING SYSTEM VIA STRING-BASED POWER COMPENSATION

CROSS-REFERENCE TO RELATED APPLICATIONS

This application claims the benefit under 35 U.S.C. section 371, of PCT International Application No. PCT/KR2020/018852, filed on Dec. 22, 2020, which is hereby incorporated by reference in its entirety.

TECHNICAL FIELD

The present disclosure relates to a solar power leveling system. More particularly, the present disclosure relates to a solar power leveling system via string-based power compensation, wherein outputs between strings are equalized by charging or discharging using a power compensation device so that output through solar power generation is maximized with a simple device configuration, and when there is reduction in output of a plurality of strings, compensation power for maximizing the total string output is calculated to achieve power compensation, whereby the power compensation device performs power compensation with a single discharging part and maximizes the total power generation amount of the strings connected to each other in parallel.

BACKGROUND ART

Solar power generation, a field of renewable energy, has been experiencing a recent surge in demand due to its numerous advantages, and technologies to improve power generation efficiency have also been developing rapidly. In particular, recently, solar power generation devices have been installed in various forms, such as on building rooftops, on water surfaces, and as building-integrated photovoltaic (BIPV) devices.

In the case of solar power generation, the power produced by each solar panel is not large, so a plurality of solar panels are connected to each other in series to form a single string and a plurality of strings are connected to each other in parallel to produce and supply power.

However, in such a case, when a power deviation between the strings occurs, the total generated power is drastically reduced because of a string with reduced generated power.

Therefore, to solve this problem, power compensation device technologies to compensate for power for a string with a reduced power generation amount have been developed. However, the conventional technologies require a separate energy storage system (ESS) to store power therein in advance in order to compensate for power for a string with reduced generated power. Therefore, facilities with a large amount of generated solar power should be equipped with a large-capacity energy storage system (ESS) for a power compensation device (for example, when compensation is performed for an hour with the power generation amount of 10 kW, a battery capacity of 10 kWh needs to be charged. In order to prepare for cases in which the amount of reduction in power generation amount is relatively large and the duration of reduction is relatively long, an energy storage system (ESS) with a large battery capacity compared to solar generation capacity should be equipped with for power compensation). Therefore, the demand for such a power compensation device is inevitably reduced in terms of cost and economics.

<Patent Document> Korean Patent No. 10-1648924 "POWER COMPENSATION DEVICE OF SOLAR POWER GENERATION SYSTEM FOR VARIABLY COMPENSATING FOR VOLTAGE CHANGE IN SOLAR MODULES"

The conventional technology disclosed in <Patent Document> also discloses a function of finding a string of which generated voltage is reduced and compensating variably for power corresponding to insufficient voltage amount. Therefore, as mentioned earlier, an energy storage system with a large battery capacity compared to solar generation capacity needs to be equipped with for power compensation as well as a separate charging system facility for charging the energy storage system. Even if charging is performed with the power generation amount resulting from solar power generation, when AC power output from an inverter is used, power conversion is performed twice (DC→AC→DC) and efficiency is thus decreased.

In addition, when there is reduction in output of a plurality of strings, a power compensation device performs compensation on the plurality of strings inevitably with the same power. Therefore, when the outputs between strings vary, it is difficult to balance the strings to be subjected to compensation, thus resulting in reduction in the total output.

Therefore, to solve these problems, there is a growing need for a technology that is capable of minimizing the cost burden of a separate power compensation device and efficiently solving a decrease in power generation efficiency caused by power deviation due to shading or fault of solar modules.

DISCLOSURE

Technical Problem

Accordingly, the present disclosure has been made keeping in mind the above problems occurring in the related art.

The present disclosure is directed to providing a solar power leveling system, wherein outputs between strings are equalized by charging or discharging using a power compensation device so that output through solar power generation is maximized with a simple device configuration, and when there is reduction in output of a plurality of strings, compensation power for maximizing the total string output is calculated to achieve power compensation, whereby the power compensation device performs power compensation with a single discharging part and maximizes the total power generation amount of the strings connected to each other in parallel.

The present disclosure is directed to providing a solar power leveling system, wherein when the total string outputs are the same, strings to be compensated and a compensation power amount are determined in such a way that the total power compensation amount is small, thereby enabling the efficient use of power stored in a power compensation device.

The present disclosure is directed to providing a solar power leveling system, wherein a power compensation device is configured as a fast charging device, and when the amount of power in the power compensation device is insufficient, the connection of an output-reduced string is switched to the power compensation device for fast charging, thereby minimizing the influence of the reduction in output of a string on the total output and increasing power generation efficiency.

The present disclosure is directed to providing a solar power leveling system, wherein during charging or discharging of a power compensation device due to reduction in output of a string, when the output of the string returns to normal, the power compensation device is immediately disconnected to minimize the use of the power compensation device, thereby extending the durability of the power compensation device and increasing power generation efficiency.

The present disclosure is directed to providing a solar power leveling system, wherein a threshold value for charging or discharging a power compensation device is specified and automatic switching between charging and discharging is performed according to the threshold value, thereby maintaining power leveling smoothly through charging or discharging within a range of the power compensation device.

The present disclosure is directed to providing a solar power leveling system, wherein the amount of power supplied for charging or discharged according to reduction in output of a string is cumulatively stored to calculate a fault index accordingly, so that a fault of the string can be diagnosed.

Technical Solution

In order to achieve the objectives above, the present disclosure is realized by an embodiment having the following configurations.

According to an embodiment of the present disclosure, there is provided a solar power leveling system including: a plurality of strings each having a plurality of solar panels connected to each other in series; a connection board for collecting power from the plurality of strings connected to each other in parallel and delivering the power, and performing a function of a protective function of a power system; an inverter for converting DC power generated using the solar panels into AC power and supplying the AC power to a consumer; a measurement link device connected to each of the plurality of strings to minimize a power deviation between the strings; and a power compensation device connected to the measurement link device to perform charging or discharging with respect to an output-reduced string among the plurality of strings, wherein the measurement link device is configured to connect the output-reduced string to the power compensation device, and control charging or discharging with power for the output-reduced string depending on an amount of power stored in the power compensation device, and the power compensation device is configured as a device capable of fast charging and to be quickly charged with generated power from the output-reduced string, and when compensation is performed for a plurality of the output-reduced strings, total string outputs according to compensation powers equal for each of the plurality of the output-reduced strings are compared to determine the compensation power for achieving maximum output.

According to another embodiment of the present disclosure, in the solar power leveling system, the measurement link device may include: a measurement part for measuring an output current or voltage of each of the strings; a switching part for controlling connection between each of the strings and the power compensation device; and a controller for controlling charging or discharging of the power compensation device.

According to still another embodiment of the present disclosure, in the solar power leveling system, the controller may include: a power generation amount reduction determination module for detecting the output-reduced string; a state-of-charge detection module for detecting the amount of power stored in the power compensation device; a charging/discharging determination module for determining whether to perform charging or discharging depending on the amount of power stored in the power compensation device; and a discharging control module for connecting the output-reduced string to the power compensation device to compensate for power through discharging of the power compensation device when the power stored in the power compensation device exceeds a set value, wherein the discharging control module may include: a reduction amount calculation module for calculating an output reduction amount of each of the plurality of the output-reduced strings; an output comparison module for comparing the total string outputs according to power compensation equal for each of the plurality of the output-reduced strings; a compensation determination module for determining a power compensation amount and the string to be compensated that achieve the maximum total string output; a compensation connection module for connecting the determined string to be compensated, through the switching part; and a power discharging module for performing compensation for each of the plurality of the connected strings with the equal power determined by the compensation determination module.

According to still another embodiment of the present disclosure, in the solar power leveling system, the compensation determination module may be configured to determine the string to be compensated and the power compensation amount in such a way that a total power compensation amount is small when the total string outputs are the same.

According to still another embodiment of the present disclosure, in the solar power leveling system, the controller includes a charging control module for connecting the output-reduced string to the power compensation device to charge the power compensation device when the power stored in the power compensation device is equal to or less than the set value, wherein the charging control module includes: a connection switching module for disconnecting the output-reduced string from the connection board through the switching part and connecting the output-reduced string to the power compensation device; and a fast charging module for quickly charging the power compensation device with the power generated by the output-reduced string.

According to still another embodiment of the present disclosure, in the solar power leveling system, the controller may include a state recovery module for returning connection of the output-reduced string depending on whether output of the output-reduced string is recovered during charging or discharging by the charging control module or the discharging control module, wherein the state recovery module may include: a power generation amount monitoring module for monitoring a power generation amount of the output-reduced string; a state recovery recognition module for recognizing that the power generation amount of the string which has been reduced is recovered; and a reconnection module for disconnecting the string from the power compensation device and reconnecting the string to the connection board through the switching part when the power generation amount is recovered.

According to still another embodiment of the present disclosure, in the solar power leveling system, the controller may include a charging/discharging switching module for performing switching between charging and discharging by specifying a threshold value for charging or discharging by the charging control module or the discharging control module, wherein the charging/discharging switching module may include: a stored power monitoring module for monitoring the amount of power stored in the power compensation device during charging or discharging; a threshold value checking module for checking whether the stored power reaches the threshold value for an upper or lower limit; a connection switching module for switching from charging to discharging or from discharging to charging when the threshold value is reached; and a charging/discharging module for performing charging or discharging according to switched connection.

According to still another embodiment of the present disclosure, in the solar power leveling system, the measurement link device may include a fault diagnosis part for diagnosing a fault of the string on the basis of a state of charge or a depth of discharge through the power compensation device according to reduction in output of the string, wherein the fault diagnosis part may include: a connection detection module for detecting connection between each of the strings and the power compensation device; a charging/discharging measurement module for measuring the state of charge or the depth of discharge through the power compensation device; a cumulative storage module for cumulatively storing the measured state of charge or the measured depth of discharge; a fault index calculation module for calculating a fault index according to the state of charge or the depth of discharge cumulated for each of the strings; and a fault string detection module for diagnosing the fault of the string corresponding to the fault index exceeding a set value.

Advantageous Effects

According to the above-described embodiments and the following features, combinations, and relations of use that will be described later, the present disclosure has the following effects.

According to the present disclosure, outputs between the strings are equalized by charging or discharging using the power compensation device so that output through solar power generation is maximized with a simple device configuration, and when there is reduction in output of the plurality of strings, compensation power for maximizing the total string output is calculated to achieve power compensation, whereby the power compensation device performs power compensation with the single discharging part and maximizes the total power generation amount of the strings connected to each other in parallel.

According to the present disclosure, when the total string outputs are the same, strings to be compensated and a compensation power amount are determined in such a way that the total power compensation amount is small, thereby enabling the efficient use of power stored in a power compensation device.

According to the present disclosure, the power compensation device is configured as a fast charging device, and when the amount of power in the power compensation device is insufficient, the connection of an output-reduced string is switched to the power compensation device for fast charging, thereby minimizing the influence of the reduction in output of a string on the total output and increasing power generation efficiency.

According to the present disclosure, during charging or discharging of the power compensation device due to reduction in output of a string, when the output of the string returns to normal, the power compensation device is immediately disconnected to minimize the use of the power compensation device, thereby extending the durability of the power compensation device and increasing power generation efficiency.

According to the present disclosure, the threshold value for charging or discharging the power compensation device is specified and automatic switching between charging and discharging is performed according to the threshold value, thereby maintaining power leveling smoothly through charging or discharging within a range of the power compensation device.

According to the present disclosure, the amount of power supplied for charging or discharged according to reduction in output of a string is cumulatively stored to calculate a fault index accordingly, so that a fault of the string can be diagnosed.

DESCRIPTION OF DRAWINGS

FIG. 1 is a configuration diagram illustrating a solar power leveling system according to an embodiment of the present disclosure FIG. 2 is a block diagram illustrating a configuration of a controller of FIG. 1

FIGS. 3 to 5 are reference diagrams illustrating an example of power compensation by a power compensation device FIG. 6 is a block diagram illustrating a configuration of a discharging control module of FIG. 2

FIG. 7 is a block diagram illustrating a configuration of a state recovery module of FIG. 2

FIG. 8 is a block diagram illustrating a configuration of a charging/discharging switching module of FIG. 2

FIG. 9 is a block diagram illustrating a configuration of a fault diagnosis part

DESCRIPTION OF THE REFERENCE NUMERALS IN THE DRAWINGS

1: solar panel 2: string 3: connection board
4: inverter 5: measurement link device 51: measurement part
52: switching part 53: controller 531: power generation amount reduction determination module
532: state-of-charge detection module 533: charging/discharging determination module 534: charging control module
534a: charging connection module 534b: fast charging module 535: discharging control module
535a: reduction amount calculation module 535b: output comparison module 535c: compensation determination module
535d: compensation connection module 535e: power discharging module 536: state recovery module
536a: power generation amount monitoring module 536b: state recovery recognition module 536c: reconnection module
537: charging/discharging switching module 537a: stored power monitoring module 537b: threshold value checking module
537c: connection switching module 537d: charging/discharging module 54: fault diagnosis part
541: connection detection module 542: charging/discharging measurement module 543: cumulative storage module
544: fault index calculation module 545: fault string detection module 6: power compensation device
61: charging part 62: discharging part 63: storage part

BEST MODE

Hereinafter, a solar power leveling system via string-based power compensation according to exemplary embodiments of the present disclosure will be described in detail with reference to the accompanying drawings. In describing the present disclosure, it is to be noted that if a detailed description of the known function or configuration makes the subject matter of the present disclosure unclear, the detailed description will be omitted. Throughout the specification, when a part "includes" an element, it is noted that it may further include other elements, but does not exclude other elements, unless specifically stated otherwise. In addition, the terms " . . . part", " . . . module", and the like mean a unit for processing at least one function or operation and may be implemented by hardware or software or a combination thereof.

A solar power leveling system via string-based power compensation according to an embodiment of the present disclosure will be described with reference to FIGS. 1 to 9. The solar power leveling system includes: a plurality of strings 2 each having a plurality of solar panels 1 connected to each other in series; a connection board 3 for collecting power from the plurality of strings 2, which are connected to each other in parallel, and delivering the power, and performing a protective function of a power system; an inverter 4 for converting DC power generated using the solar panels 1 into AC power and supplying the AC power to a consumer; a measurement link device 5 connected to each of the plurality of strings 2 to minimize a power deviation between the strings 2; and a power compensation device 6 connected to the measurement link device 5 to perform charging or discharging with respect to an output-reduced string 2.

According to the present disclosure, the solar power leveling system maintains powers output from the respective strings 2 evenly to increase power generation efficiency. The configuration of the power leveling system is simplified without problems that a separate power supply device is required or a large-capacity energy storage device needs to be used because a conventional energy storage device unilaterally compensates for power.

Accordingly, the solar power leveling system enables an output-reduced string to be compensated for power when power stored in the power compensation device is sufficient. However, when the power stored in the power compensation device is insufficient, the solar power leveling system disconnects the output-reduced string 2 from the connection board 3 and connects the output-reduced string 2 to the power compensation device 6 to transmit the power generated by the output-reduced string 2 to the power compensation device 6 for charging.

In particular, according to the present disclosure, a fast charging device, such as a supercapacitor, capable of being charged with a large amount of power at a very fast speed is used as the power compensation device 6, so that the time required for charging from the output-reduced string 2 is reduced and the power compensation device discharges the stored power to the output-reduced string 2 for a sufficient period of time to achieve compensation for power.

According to the present disclosure, the solar power leveling system continuously maintains a state in which the outputs between the strings 2 are equalized, and stores the power generated by an output-reduced string 2 in the power compensation device 6 to avoid loss of the generated power, and reduces the time required for charging the power compensation device 6 to increase power generation efficiency. This process is performed by a single power compensation device 6 formed using a supercapacitor, without a separate power supply device, so that the system configuration can be simplified.

In addition, according to the present disclosure, in order to achieve effective power leveling even when there is reduction in output of a plurality of strings 2, power compensation for the output-reduced strings 2 is performed in such a way as to maximize the total output of the strings 2 connected to each other in parallel. In particular, power compensation from the power compensation device 6 for the plurality of strings 2 needs to be performed with equal power values. Otherwise, the power compensation device 6 needs to be equipped with a plurality of discharging parts 62 capable of supplying power with different voltage or current values, thus resulting in very high installation cost and making the device complex.

Accordingly, in the present disclosure, power compensation for a plurality of output-reduced strings is performed in such a way as to maximize output with only one discharging part 62, which supplies a single power, of the power compensation device 6, thus achieving both an economical device configuration and efficient power generation.

According to the present disclosure, even when there is reduction in output of a plurality of strings 2, efficient power generation is achieved through power leveling and the device is simplified and an economical configuration is maintained.

The solar panels 1 are devices for producing power using sunlight, and a plurality of solar panels are formed in series and constitute one string.

Each of the strings 2 is formed by connecting the solar panels 1 in series. The plurality of solar panels 1 are connected to each other in series, forming a DC circuit. The plurality of strings 2 are connected in parallel to the connection board 3.

The connection board 3 facilitates wiring between the strings 2 and the inverter 4 and performs various protective functions. In the system of the present disclosure, the connection board may include elements, such as an element for preventing reverse current, commonly included in a solar power generation connection board.

The inverter 4 converts DC power generated using sunlight into AC power and supplies the AC power to a consumer. The inverter converts the DC power (DC), which is generated at the stage of each of the strings 2 constituting serial circuits, into the AC power (AC), which can be used by a consumer, and transmits the AC power to a system.

The measurement link device 5 is connected to each of the plurality of strings 2 connected to each other in parallel and uses the power compensation device 6 to equalize the outputs of the strings 2. The measurement link device measures the power output from each string 2, controls the connection between each string 2 and the power compensation device 6, and controls charging or discharging of the power compensation device 6. In addition, the measurement link device 5 diagnoses faults of the strings 2 on the basis of the state of charge or the depth of discharge using the power compensation device 6 according to reduction in the outputs of the strings 2. To this end, the measurement link device 5 may include a measurement part 51, a switching part 52, a controller 53, and a fault diagnosis part 54.

The measurement part 51 measures output current or voltage of the strings 2. A sensor capable of measuring current or voltage is provided at each of the plurality of strings 2 and transmits the measured current or voltage values to the controller 53. Accordingly, the controller 53 may measure the power output from each string 2 according to the current or voltage measured by the measurement part 51, and may determine whether power in a normal state is generated and output from each string 2 or power generation amount is reduced because of a fault or shading of a particular string 2 and reduced power is output.

The switching part 52 controls the connection between the strings 2 and the power compensation device 6. The switching part may connect or disconnect the strings 2 to or from the power compensation device 6 through a switching method, such as a relay. More specifically, the switching part 52 connected an output-reduced string 2 to the power compensation device 6 to compensate for power for each string 2 or to supply the power output from each string 2 to the power compensation device 6 for charging. In particular, when the power compensation device 6 is charged, the output-reduced string 2 is disconnected from the connection board 3 and is connected to the power compensation device 6 so that the power output from the string 2 is supplied to the power compensation device 6.

The controller 53 controls charging or discharging using the power compensation device 6 with respect to an output-reduced string 2. The controller detects an output-reduced string 2 according to the output of each string 2. When an output-reduced string 2 is detected, the controller determines whether to perform charging or discharging with respect to the output-reduced string 2 depending on the state of charge stored in the power compensation device 6. In addition, the controller 53 connects the power compensation device 6 to an output-reduced string 2 for charging or discharging. When the output of the string 2 is recovered to normal even during charging or discharging, the string is disconnected from the power compensation device 6 and returns to a normal state. In addition, the controller 53 sets a threshold value for charging or discharging according to the state of charge of the power compensation device 6 during charging or discharging with respect to an output-reduced string 2, so that the power compensation device 6 is efficiently used and generated power is maximized and power leveling between the strings 2 is continuously maintained. To this end, the controller 53 may include a power generation amount reduction determination module 531, a state-of-charge detection module 532, a charging/discharging determination module 533, a charging control module 534, a discharging control module 535, a state recovery module 536, and a charging/discharging switching module 537.

The power generation amount reduction determination module 531 detects an output-reduced string 2. The power generation amount reduction determination module calculates an output of each string 2 according to the current or voltage of each string 2 measured by the measurement part 51 and compares the outputs of the strings to detect an output-reduced string 2. In addition, the power generation amount reduction determination module 531 may detect a plurality of output-reduced strings 2. In this case, charging or discharging may be simultaneously performed with respect to the plurality of strings 2. In particular, in discharging with respect to a plurality of strings 2, the strings 2 to be compensated and compensation power are determined in such a way as to maintain the maximum output, thereby maximizing power generation efficiency.

The state-of-charge detection module 532 detects the state of charge of the power compensation device 6 when an output-reduced string 2 is detected. The state-of-charge detection module 532 measures the amount of remaining power in the power compensation device 6.

The charging/discharging determination module 533 determines whether to perform charging or discharging depending on the amount of remaining power in the power compensation device 6 detected by the state-of-charge detection module 532. The charging/discharging determination module 533 determines charging or discharging between the output-reduced string 2 and the power compensation device 6. More specifically, the charging/discharging determination module 533 determines whether to perform charging or discharging depending on the amount of remaining power in the power compensation device 6 when an output-reduced string 2 occurs. When the amount of remaining power is equal to or less than a set value, the power generated by the output-reduced string 2 is supplied to the power compensation device 6 for charging. When the amount of remaining power exceeds the set value, the power is supplied from the power compensation device 6 to the output-reduced string 2 to achieve compensation for power.

The charging control module 534 supplies the power generated by an output-reduced string 2 to the power compensation device 6 for charging. When the charging/discharging determination module 533 determines that the amount of remaining power in the power compensation device 6 is equal to or less than the set value, the charging control module 534 charges the power compensation device 6. Herein, the charging control module 534 connects the output-reduced string 2 to the power compensation device 6 and disconnects the output-reduced string 2 from the connection board 3, and supplies the generated power to the power compensation device 6. The charging control module 534 may connect a plurality of output-reduced strings 2 to the power compensation device 6. Therefore, the charging control module 534 equalizes the outputs between the remaining strings 2 excluding the output-reduced string 2. The power compensation device 6 is quickly charged with the power of the output-reduced string 2, and after a certain level of charging is quickly achieved, the output-reduced string 2 is compensated. Accordingly, the charging control module 534 achieves fast charging with power generated by the strings 2 and compensation later, so that the loss due to reduction in output of the strings 2 is minimized and power generation efficiency is maximized only with a simple configuration and the power compensation device 6 having a small capacity. To this end, the charging control module 534 may include a charging connection module 534a, and a fast charging module 534b.

The charging connection module 534a connects an output-reduced string 2 to the power compensation device 6. The charging connection module 534a disconnects the string 2 from the connection board 3 and connects the string 2 to the power compensation device 6. The charging connection module 534a controls the operation of the switching part 52 to establish the connection to the power compensation device 6 and the connection to a charging part 61 of the power compensation device 6.

The fast charging module 534b supplies power from an output-reduced string 2 to the power compensation device 6. After the output-reduced string 2 is connected to the power compensation device 6, the fast charging module 534b supplies the power generated from the output-reduced string 2 to the power compensation device 6 for charging. In addition, the fast charging module 534b enables the power compensation device 6 to be charged up to the set threshold value. When the output-reduced state continues even after charging up to the threshold value is completed, the output-reduced string 2 is compensated for power through the power compensation device 6, conversely. In addition, when the output of the output-reduced string 2 is recovered to a normal state even before power charging up to the threshold value, the fast charging module 534b stops power charging and reconnects the output-reduced string 2 to the connection board 3 for normal output.

The discharging control module 535 supplies power from the power compensation device 6 to an output-reduced string 2 so that compensation for power is achieved for power leveling. When the charging/discharging determination module 533 determines that the amount of remaining power in the power compensation device 6 exceeds the set value and determines to discharge the power compensation device 6, the discharging control module 535 connects the output-reduced string 2 to the power compensation device 6 to compensate for power. In particular, when there are a plurality of output-reduced strings 2, the discharging control module 535 determines compensation power and the strings 2 to be compensated, in such a way as to maximize generated power in order to maximize power generation efficiency. In other words, the power compensation device 6 compensates for power for the output-reduced strings 2 through the discharging part 62. In general, the discharging part 62 causes compensation to be performed with a single power of the same value for each of the plurality of output-reduced strings 2. Otherwise, it is necessary to provide a plurality of discharging parts 62 capable of supplying power with different current or voltage values, thus resulting in increase in installation and operation costs and making the configuration of the device complex. Therefore, the discharging control module 535 calculates the amount of output-reduced output for each of the plurality of output-reduced strings 2, and compares the total outputs of the strings 2 connected to each other in parallel according to the amount of compensation power for each of the strings 2 so as to determine compensation power and the strings 2 to be compensated, in such a way as to maximize the total power generation amount of the strings 2. To this end, the discharging control module 535 may include a reduction amount calculation module 535a, an output comparison module 535b, a compensation determination module 535c, a compensation connection module 535d, and a power discharging module 535e.

The reduction amount calculation module 535a calculates the amount of output reduced from a normal state of a string 2. The reduction amount calculation module 535a calculates the output reduction amount for each of the plurality of output-reduced strings 2.

The output comparison module 535b inputs compensation power to each string 2 according to the output reduction amounts calculated by the reduction amount calculation module 535a and compares the total power generation amounts of the strings 2 connected to each other in parallel. Compensation power, for example, compensation power for bring each string 2 to a normal output, is input to each string 2 and the power generation amounts are compared.

The compensation determination module 535c determines strings 2 to be subjected to power compensation and compensation power according to a result of comparison by the output comparison module 535b in such a way as to maximize the total power generation amount of the strings 2 connected to each other in parallel. Accordingly, the compensation determination module 535c maximizes power generation efficiency while using the single discharging part 62. In addition, the compensation determination module 535c achieves compensation in such a way that the total power compensation amount is small when the total outputs are the same according to compensation powers, thereby enabling the efficiently use of the power stored in the power compensation device 6.

An example of power compensation by the compensation determination module 535c will be described with reference to FIGS. 3 to 5. First, in the case of FIG. 3, let's assume that there are 10 strings 2 connected to each other in parallel and three 27, 28, and 29 of the strings have outputs reduced from a normal output of 100 by 10, 20, and 30, respectively. Herein, as shown in FIG. 3(a), in order to make all the output-reduced strings 27, 28, and 29 have the normal output of 100, if each of the strings 27, 28, and 29 is compensated with the power of 30, the strings 27, 28, and 29 have the outputs of 120, 110, and 100, respectively. In this case, while the remaining seven normal strings 20, . . . , 26 have the output of 100, the strings 2 with the outputs of 120 and 110, which exceed 100, do not affect the total output of the strings 2. This results in a phenomenon in which the outputs become 0, as if no power was generated. Therefore, in the case of FIG. 3(a), the total power generation amount is 800 (100×8). Accordingly, as shown in FIG. 3(b), if compensation power is given as 10 each corresponding to the string 29 with the largest reduction amount, the total output of the strings 20, . . . , 29 also becomes 800 (80×10) in accordance with the lowest output of 80. However, as shown in FIG. 3(c), if compensation power is given as 20 each corresponding to the string 28 with the power reduced by 20, the output of the string 29 with the lowest output becomes 90 and the output of the string 27 with the output exceeding 100 becomes 0, thus resulting in an increase in the total output of 810 (90×9). Accordingly, in the case of FIG. 3, each of the output-reduced strings 27, 28, and 29 is compensated with the power of 20, so that the total output of the strings 20, . . . , 29 connected to each other in parallel is maximized.

In addition, FIG. 4 shows a case in which the outputs of output-reduced strings 27, 28, and 29 are 90, 80, and 40, respectively. As in FIG. 3(c), if compensation power is given as 20 each corresponding to the output of the string 28 with the intermediate output reduction, the total output is determined in accordance with the string 29 with the lowest output of 60 as shown in FIG. 4(a) and the output of the string 27 exceeding the normal output of 100 becomes 0, resulting in the total output of 540 (60×9). Accordingly, as shown in FIG. 4(b), if compensation power is given as 60 each corresponding to the string 29 with the lowest output, the outputs of the strings 27 and 28 exceeding the normal output of 100 become 0, resulting in an increase in the total output of 800 (100×8). In addition, as shown in FIG. 4(c), compensation is not performed on the string 27 with the highest output and the string 29 with the lowest output is raised to match the string 27 with the highest output, resulting in a further increase in the total output of 810 (90×9).

In addition, FIG. 5 shows a case in which the outputs of output-reduced strings 27, 28, and 29 are 90, 40, and 30, respectively. Both FIGS. 5(a) and (b) may achieve the same maximum power generation amount of 810. However, in the case of FIG. 5(b), power compensation is performed except the string 27 with the highest output, so that the total power compensation amount is 120 (60×2) which is smaller than the total power compensation amount of 180 (60×3) in FIG. 5(a), achieving the more efficient use of power.

Thus, the compensation determination module 535c maximizes the total power generation amount of the strings 2 connected to each other in parallel, and achieves the efficient use of the power stored in the power compensation device 6, thereby maximizing power generation efficiency. Such power generation is achieved through the single discharging part 62, thereby reducing the overall installation and operation costs.

The compensation connection module 535d connects an output-reduced string 2 to the power compensation device 6 through the operation of the switching part 52. The compensation connection module 535d connects a string 2 determined by the compensation determination module 535c to be compensated to the discharging part 62 of the power compensation device 6 so that the string is supplied with the power discharged from the power compensation device 6.

The power discharging module 535e performs compensation for power on an output-reduced string 2 from the power compensation device 6. Power compensation is performed on a string 2 connected by the compensation connection module 535d. The power discharging module 535e enables compensation to be performed as much as the compensation power determined by the compensation determination module 535c. When the output of a string 2 is not recovered even after discharging up to the threshold value, switching to the charging control module 534 takes place and the power compensation device 6 is charged. During this process, when the output of the string 2 is recovered, the string 2 is disconnected from the power compensation device 6 and returns to a normal state.

The state recovery module 536 disconnects an output-reduced string 2 from the power compensation device 6 and provides the powers of all the strings 2 to the connection board 3. When the output of the output-reduced string 2 is recovered to a normal state and the outputs of all the strings 2 are equalized, the state recovery module 536 disconnects the output-reduced string 2 from the power compensation device 6. Accordingly, the state recovery module 536 enables a direct return to a normal state when an output is recovered without achieving charging or discharging up to the threshold value, so that the use of the power compensation device 6 is minimized to extend its durability. In particular, when the power compensation device 6 is charged by an output-reduced string 2, the state recovery module 536 minimizes the time required for disconnecting the string 2 through an immediate return to a normal state, thereby maximizing power generation amount. To this end, the state recovery module 536 may include a power generation amount monitoring module 536a, a state recovery recognition module 536b, and a reconnection module 536c.

The power generation amount monitoring module 536a monitors the power generation amount of an output-reduced string 2. Even during charging or discharging by the charging control module 534 or the discharging control module 535 for an output-reduced string 2, the power generation amount monitoring module 536a monitors the amount of power generated from the string 2.

The state recovery recognition module 536b detects whether an output of an output-reduced string 2 is recovered to a normal state. Whether the recovery to the normal state is made is detected according to the power generation amount measured by the power generation amount monitoring module 536a.

The reconnection module 536c disconnects an output-reduced string 2 from the power compensation device 6 when the output of the output-reduced string 2 is recovered to a normal state. When the output-reduced string 2 is disconnected from the connection board 3 and the power compensation device 6 is charged, the reconnection module 536c disconnects the output-reduced string 2 from the power compensation device 6 and reconnects the output-reduced string 2 to the connection board 3. When power is supplied from the power compensation device 6, the reconnection module 536c only disconnects the output-reduced string 2 from the power compensation device 6.

The charging/discharging switching module 537 controls charging or discharging the power compensation device 6 according to the amount of remaining power in the power compensation device 6. The charging/discharging switching module 537 sets respective threshold values for charging and discharging so that charging and discharging are achieved within ranges of the threshold values. In other words, when the charging control module 534 charges the power compensation device 6 with the power from an output-reduced string 2, the charging/discharging switching module 537 enables charging only up to a predetermined upper limit value. When the upper limit value is reached, switching to a discharging state takes place and the discharging control module 535 enables the output-reduced string 2 to be compensated for power. In addition, when the discharging control module 535 is in operation and the amount of power stored in the power compensation device 6 reaches the lower limit threshold value, discharging is stopped and the charging control module 534 charges the power compensation device 6. Accordingly, the charging/discharging switching module 537 is capable of preventing excessive charging or discharging of the power compensation device 6 and of appropriately maintaining the time required for disconnection between the strings 2 and the connection board 3 by the charging control module 534, thereby minimizing the loss of power generation efficiency. To this end, the charging/discharging switching module 537 may include a stored power monitoring module 537a, a threshold value checking module 537b, a connection switching module 537c, and a charging/discharging module 537d.

The stored power monitoring module 537a monitors the stored power remaining in the power compensation device 6. The stored power monitoring module 537a monitors the stored power during the operation of the charging control module 534 or the discharging control module 535.

The threshold value checking module 537b checks whether the power remaining in the power compensation device 6 reaches a threshold value. The threshold value checking module 537b checks whether the upper limit threshold value is reached when the charging control module 534 is in operation, or checks whether the lower limit threshold value is reached when the discharging control module 535 is in operation.

The connection switching module 537c switches the connection between an output-reduced string 2 and the charging part 61 or the discharging part 62. When the power remaining in the power compensation device 6 reaches the upper limit threshold value during the operation of the charging control module 534, the connection switching module 537c makes switching to the operation of the discharging control module 535 so as to connect the output-reduced string 2 to the discharging part 62 of the power compensation device 6 and connect the string 2 to the connection board 3 to achieve compensation for power. In addition, when the lower limit threshold value is reached during the operation of the discharging control module 535, the connection switching module 537c makes switching to the operation of the charging control module 534 so as to connect the string 2 to the charging part 61 and disconnect the string 2 from the connection board 3.

The charging/discharging module 537d enables charging or discharging according to a state switched by the connection switching module 537c. Depending on the state in which switching to the discharging control module 535 or the charging control module 534 is made, the charging/discharging module 537d enables compensation for power from the power compensation device 6 or charging of the power compensation device 6.

The fault diagnosis part 54 diagnoses abnormal states of the strings 2. The fault diagnosis part 54 detects and reports the strings 2 in which abnormally frequent and large output reductions occur. More specifically, the fault diagnosis part 54 cumulatively stores the amount of power supplied for charging from or discharged to an output-reduced string 2 depending on the operation of the charging control module 534 or the discharging control module 535. The fault diagnosis part 54 calculates a fault index for the occurrence of abnormality according to the degree of accumulation of the state of charge and the depth of discharge at regular intervals. When the fault index exceeds a set value, the fault diagnosis part 54 diagnoses the occurrence of abnormality. Accordingly, the fault diagnosis part 54 diagnoses and reports faults of the strings 2 as well as dealing with shading or temporary abnormalities of the strings 2, so that a solar power generation device is efficiently managed. To this end, the fault diagnosis part 54 may include a connection detection module 541, a charging/discharging measurement module 542, a cumulative storage module 543, a fault index calculation module 544, and a fault string detection module 545.

The connection detection module 541 detects the connection between the strings 2 and the power compensation device 6. The connection detection module 541 detects that the outputs of the strings 2 are reduced and connection is made by the operation of the charging control module 534 or the discharging control module 535.

The charging/discharging measurement module 542 measures the amount of power supplied for charging from an output-reduced string 2 or discharged to the string 2 according to the operation of the charging control module 534 or the discharging control module 535. The charging/discharging measurement module 542 may enable the measurement part 51 to perform measurement.

The cumulative storage module 543 cumulatively stores the state of charge or the depth of discharge measured by the charging/discharging measurement module 542. The cumulative storage module 543 adds up and stores the state of charge or the depth of discharge for each string 2.

The fault index calculation module 544 calculates a fault index according to the state of charge or the depth of discharge cumulatively stored by the cumulative storage module 543. The fault index is calculated at regular intervals. The fault index calculation module 544 divides a value of the state of charge or the depth of discharge cumulatively stored into a plurality of sections and calculates a fault index set for each of the sections. The greater the state of charge or the depth of discharge by the charging control module 534 or the discharging control module 535, the greater and the more frequent the degree of reduction in output of a string 2. Therefore, the greater the accumulated state of charge or depth of discharge, the higher the fault index that the fault index calculation module 544 sets. The higher the fault index, the higher the probability of abnormality occurrence.

The fault string detection module 545 detects a string 2 in which an abnormality has occurred. When a fault index calculated by the fault index calculation module 544 exceeds a set value, the fault string detection module 545 diagnoses and reports the occurrence of an abnormal state so that prompt measures are taken.

The power compensation device 6 performs charging or discharging with respect to an output-reduced string 2. An energy storage device capable of fast charging may be used, and preferably, a supercapacitor may be used. Since a super capacitor has a very fast momentary charging speed, the power compensation device 6 momentarily absorbs the power of an output-reduced string 2 and the operating time of the charging control module 534 is minimized, thereby maintaining power leveling and maximizing power generation efficiency. The power compensation device 6 may include: the charging part 61 for storing power supplied from an output-reduced string 2; the discharging part 62 for supplying power to an output-reduced string 2; and a storage part 63 for storing power therein.

The charging part 61 receives power from an output-reduced string 2 and stores the power in the storage part 63. The charging part 61 is connected to each string 2 to receive power, and the connection is controlled by the switching part 52. In particular, the charging part 61 enables momentary charging from an output-reduced string 2 through fast charging, so that the time required for charging is minimized and switching to compensation for power is quickly made, thereby increasing power generation efficiency. In addition, the charging part 61 converts high-voltage power delivered from the string 2 into low-voltage power so that the low-voltage power is stored in the storage part 63. The charging part 61 may include a maximum power point tracking (MPPT) function for efficient charging when charging with power from a plurality of strings 2 takes place.

The discharging part 62 supplies power to an output-reduced string 2. The discharging part 62 is connected to each string 2 to achieve compensation for power, and the connection is controlled by the switching part 52. It is desirable that even when there is reduction in output of a plurality of strings 2, the discharging part 62 supplies a single voltage or current equally to the plurality of strings 2. Accordingly, installation and operation costs are reduced and the configuration is simplified. However, a plurality of the discharging parts 62 may be configured to supply different powers. In this case, installation and operation costs increase, but depending on installation environment, power generation efficiency may be further increased slightly. Even when the plurality of the discharging parts 62 are configured, compensation is performed by determining compensation powers and the strings 2 to be compensated under the control of the discharging control module 535 in such a way as to maximize the total power generation amount. In addition, the discharging part 62 discharges at a lower speed than the charging part 61 charges, and enables discharge at an appropriate speed to achieve equalization with the other strings 2.

The storage part 63 stores power therein. The storage part is connected to the charging part 61 and the discharging part 62, and enables charging from an output-reduced string 2 or compensation for power to the string 2.

Although the application has described various embodiments of the present disclosure, the embodiments are only embodiments that realize the technical idea of the present disclosure. Any changes or modifications that realize the technical idea of the present disclosure should be constructed as belonging to the scope of the present disclosure.

The invention claimed is:

1. A solar power leveling system, comprising:
  a plurality of strings each having a plurality of solar panels connected to each other in series;
  a connection board for collecting power from the plurality of strings connected to each other in parallel and delivering the power, and performing a function of a protective function of a power system;
  an inverter for converting DC power generated using the solar panels into AC power and supplying the AC power to a consumer;
  a measurement link device connected to each of the plurality of strings to minimize a power deviation between the strings; and a power compensation device connected to the measurement link device to perform charging or discharging with respect to an output-reduced string among the plurality of strings,
wherein the measurement link device is configured to connect the output-reduced string to the power compensation device, and control charging or discharging with power for the output-reduced string depending on an amount of power stored in the power compensation device, and
the power compensation device is configured as a device capable of fast charging and to be quickly charged with generated power from the output-reduced string, and
when compensation is performed for a plurality of the output-reduced strings, total string outputs according to compensation powers equal for each of the plurality of the output-reduced strings are compared to determine the compensation power for achieving maximum output.

2. The solar power leveling system of claim 1, wherein the measurement link device comprises:
a measurement part for measuring an output current or voltage of each of the strings;
a switching part for controlling connection between each of the strings and the power compensation device; and
a controller for controlling charging or discharging of the power compensation device.

3. The solar power leveling system of claim 2, wherein the controller comprises:
a power generation amount reduction determination module for detecting the output-reduced string;
a state-of-charge detection module for detecting the amount of power stored in the power compensation device;
a charging/discharging determination module for determining whether to perform charging or discharging depending on the amount of power stored in the power compensation device; and
a discharging control module for connecting the output-reduced string to the power compensation device to compensate for power through discharging of the power compensation device when the power stored in the power compensation device exceeds a set value,
wherein the discharging control module comprises:
a reduction amount calculation module for calculating an output reduction amount of each of the plurality of the output-reduced strings;
an output comparison module for comparing the total string outputs according to power compensation equal for each of the plurality of the output-reduced strings;
a compensation determination module for determining a power compensation amount and the string to be compensated that achieve the maximum total string output;
a compensation connection module for connecting the determined string to be compensated, through the switching part; and
a power discharging module for performing compensation for each of the plurality of the connected strings with the equal power determined by the compensation determination module.

4. The solar power leveling system of claim 3, wherein the compensation determination module is configured to determine the string to be compensated and the power compensation amount in such a way that a total power compensation amount is small when the total string outputs are the same.

5. The solar power leveling system of claim 3, wherein the controller comprises
a charging control module for connecting the output-reduced string to the power compensation device to charge the power compensation device when the power stored in the power compensation device is equal to or less than the set value,
wherein the charging control module comprises:
a charging connection module for disconnecting the output-reduced string from the connection board through the switching part and connecting the output-reduced string to the power compensation device; and
a fast charging module for quickly charging the power compensation device with the power generated by the output-reduced string.

6. The solar power leveling system of claim 5, wherein the controller comprises
a state recovery module for returning connection of the output-reduced string depending on whether output of the output-reduced string is recovered during charging or discharging by the charging control module or the discharging control module,
wherein the state recovery module comprises:
a power generation amount monitoring module for monitoring a power generation amount of the output-reduced string;
a state recovery recognition module for recognizing that the power generation amount of the string which has been reduced is recovered; and
a reconnection module for disconnecting the string from the power compensation device and reconnecting the string to the connection board through the switching part when the power generation amount is recovered.

7. The solar power leveling system of claim 5, wherein the controller comprises
a charging/discharging switching module for performing switching between charging and discharging by specifying a threshold value for charging or discharging by the charging control module or the discharging control module,
wherein the charging/discharging switching module comprises:
a stored power monitoring module for monitoring the amount of power stored in the power compensation device during charging or discharging;
a threshold value checking module for checking whether the stored power reaches the threshold value for an upper or lower limit;
a connection switching module for switching from charging to discharging or from discharging to charging when the threshold value is reached; and
a charging/discharging module for performing charging or discharging according to switched connection.

8. The solar power leveling system of claim 5, wherein the measurement link device comprises
a fault diagnosis part for diagnosing a fault of the string on the basis of a state of charge or a depth of discharge through the power compensation device according to reduction in output of the string,
wherein the fault diagnosis part comprises:
a connection detection module for detecting connection between each of the strings and the power compensation device;

a charging/discharging measurement module for measuring the state of charge or the depth of discharge through the power compensation device;

a cumulative storage module for cumulatively storing the measured state of charge or the measured depth of discharge;

a fault index calculation module for calculating a fault index according to the state of charge or the depth of discharge cumulated for each of the strings; and a fault string detection module for diagnosing the fault of the string corresponding to the fault index exceeding a set value.

* * * * *